(12) United States Patent
Chen et al.

(10) Patent No.: US 11,062,952 B2
(45) Date of Patent: Jul. 13, 2021

(54) METHOD OF FORMING A SEMICONDUCTOR STRUCTURE BY SACRIFICIAL LAYERS AND SPACER

(71) Applicants: Semiconductor Manufacturing International (Shanghai) Corporation, Shanghai (CN); Semiconductor Manufacturing International (Beijing) Corporation, Beijing (CN)

(72) Inventors: Zhuofan Chen, Shanghai (CN); Haiyang Zhang, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/861,823

(22) Filed: Apr. 29, 2020

(65) Prior Publication Data
US 2021/0183706 A1    Jun. 17, 2021

(30) Foreign Application Priority Data
Dec. 11, 2019   (CN) .......................... 201911265639.1

(51) Int. Cl.
  *H01L 21/02*   (2006.01)
  *H01L 21/8234*   (2006.01)
  *H01L 21/768*   (2006.01)
  *H01L 21/8238*   (2006.01)

(52) U.S. Cl.
CPC .. *H01L 21/823425* (2013.01); *H01L 21/7688* (2013.01); *H01L 21/76837* (2013.01); *H01L 21/823864* (2013.01)

(58) Field of Classification Search
CPC ......... H01L 21/02063; H01L 21/76805; H01L 21/76831; H01L 21/7688; H01L 21/76897
See application file for complete search history.

(56) References Cited

U.S. PATENT DOCUMENTS

2019/0157405 A1* 5/2019 Huang ................ H01L 21/3115

* cited by examiner

*Primary Examiner* — Hoai V Pham
(74) *Attorney, Agent, or Firm* — Brinks Gilson & Lione

(57) ABSTRACT

The present disclosure provides a semiconductor structure and a forming method thereof. The forming method includes forming sacrificial layers and spacer on a dielectric layer, wherein the sacrificial layers and the spacer cover the dielectric layer at the top of a gate and expose the dielectric layer on at least part of source-drain doping layers, the sacrificial layers include the first sacrificial layer located on the dielectric layer at the top of the gate, and side walls of the first sacrificial layer are provided with the spacer; after the sacrificial layers and the spacer is formed, the first sacrificial layer is removed; and the dielectric layer is etched with a patterning layer as a mask, and a first contact hole and second contact holes are formed in the dielectric layer. The embodiments and implementations of the present disclosure can avoid double graphics of the dielectric layer and the alignment error.

19 Claims, 7 Drawing Sheets

METHOD OF FORMING A SEMICONDUCTOR STRUCTURE BY SACRIFICIAL LAYERS AND SPACER

RELATED APPLICATIONS

The present application claims priority to Chinese Patent Appln. No. 201911265639.1, filed Dec. 11, 2019, the entire disclosure of which is hereby incorporated by reference.

BACKGROUND

Technical Field

The present disclosure relates to the technical field of semiconductor manufacturing, and particularly relates to a semiconductor structure and a forming method thereof.

Related Art

A metal-oxide-semiconductor (MOS) transistor is one of the most important elements in modern integrated circuits. A basic structure of the MOS transistor includes a semiconductor substrate; a gate located on the surface of the semiconductor substrate; source-drain doping layers located in the positions, on the two sides of the gate, in the semiconductor substrate; a dielectric layer covering the substrate, a gate and the source-drain doping structure; a gate contact hole, source-drain contact holes, wherein the gate contact hole and the source-drain contact holes are located in the dielectric layer, the bottom of the gate contact hole exposes the gate, and the bottoms of the source-drain contact holes expose the source-drain doping layers, and plugs located between the gate contact hole and the source-drain contact holes.

With the development of a semiconductor technology, the integration degree of a semiconductor device structure has been increasing, the size of the semiconductor structure has been shrinking, the thickness of an isolation structure between the plugs is gradually smaller, and the formation of the isolation structure becomes more and more difficult.

How to form an isolation structure with a small thickness is an urgent problem to be solved for increasing the semiconductor integration degree.

SUMMARY

The technical aim of the present disclosure is to provide a semiconductor structure and a forming method thereof, and thus the process difficulty can be lowered while the integration degree of the semiconductor structure is increased.

Technical solutions of the present disclosure provides a forming method of the semiconductor structure. In one form, a forming method includes: providing a substrate, wherein a gate is located on the substrate, source-drain doping layers are located in positions, on two sides of the gate, in the substrate, and a dielectric layer is located on the gate and the source-drain doping layers; forming a patterning layer on the dielectric layer, wherein the steps of forming the patterning layer include forming sacrificial layers and spacer on the dielectric layer, wherein the sacrificial layers and the spacer cover the dielectric layer at the top of the gate and expose the dielectric layer on at least part of the source-drain doping layers, the sacrificial layers include the first sacrificial layer located on the dielectric layer at the top of the gate, and side walls of the first sacrificial layer are provided with the spacer; after the sacrificial layers and the spacer is formed, removing the first sacrificial layer; and etching the dielectric layer with the patterning layer as a mask, and forming a first contact hole and second contact holes in the dielectric layer, wherein the bottom of the first contact hole exposes the gate, and the bottoms of the second contact holes expose the source-drain doping layers.

In some implementations, the steps of forming the patterning layer also include: before the sacrificial layers and the spacer is formed on the dielectric layer, forming an initial patterning layer on the dielectric layer; and after the first sacrificial layer is removed, etching the initial patterning layer with the remaining sacrificial layer and the spacer as a mask to form the patterning layer.

In some implementations, the first sacrificial layer covers the dielectric layer at the top of part of the gate; and the sacrificial layers also include the second sacrificial layer, and the second sacrificial layer covers the dielectric layer at the top of the gate exposed by the first sacrificial layer.

In some implementations, the steps of forming the sacrificial layers and the spacer on the dielectric layer include: forming the first sacrificial layer on the dielectric layer, wherein the first sacrificial layer only covers the dielectric layer on part of the gate; forming the spacer on the side walls of the first sacrificial layer; and after the spacer is formed, forming the second sacrificial layer on the dielectric layer, wherein the second sacrificial layer covers the gate exposed by the first sacrificial layer and exposes the dielectric layer at the tops of at least part of the source-drain doping layers.

In some implementations, the steps of forming the first sacrificial layer on the dielectric layer include: forming a first initial sacrificial layer on the dielectric layer; forming a first mask layer on the first initial sacrificial layer, wherein the first mask layer exposes the first initial sacrificial layer on at least part of the gate; conducting ion implantation on the first initial sacrificial layer with the first mask layer as a mask to form the first sacrificial layer; and after ion implantation, removing the first initial sacrificial layer.

In some implementations, after the spacer is formed, the steps of forming the second sacrificial layer on the dielectric layer include: forming a second intermediate sacrificial layer on the dielectric layer, wherein the second intermediate sacrificial layer exposes the spacer and the first sacrificial layer; and etching the second intermediate sacrificial layer, and removing the second intermediate sacrificial layer on at least part of the source-drain doping layers to form the second sacrificial layer.

Compared with the prior art, technical solutions of the present disclosure has the following advantages that:

In forms of the forming method of the semiconductor structure provided by the technical solution of the present disclosure, by forming the patterning layer through the method of removing the first sacrificial layer after the spacer located on the side walls of the first sacrificial layer are formed, the spacer can be formed between openings for exposing the dielectric layer at the tops of the source-drain doping layers and openings for exposing the dielectric layer at the top of the gate of the sacrificial layers, the thickness of the spacer is small, and thus the integration degree of the semiconductor structure can be increased. Meanwhile, through the method of forming the spacer, the first contact hole and the second contact holes can be formed only by conducting a one-time patterning process on the dielectric layer, the problem of graphic alignment in the double patterning process can be avoided, then the process can be simplified, and the accuracy of the formed semiconductor structure can be improved.

Further, after the first sacrificial layer is formed, the initial patterning layer is formed on the dielectric layer, and the patterning layer can be subsequently formed through the initial patterning layer. Through transmission of the initial patterning layer, the material of the patterning layer can be consistent, thus the dielectric layer can be etched by selecting gas with the high etching selection ratio in the process of etching the dielectric layer, the accuracy of the sizes of the first contact hole and the second contact holes can be guaranteed, and penetrating of the first contact hole and the second contact holes is avoided.

DETAILED DESCRIPTION

There are many problems in a semiconductor forming method, for example: contact holes of a dielectric layer at the tops of source-drain doping layers and a gate need to be formed through a double patterning process, which will bring about the problem of pattern alignment, which increases the process difficulty.

A technical solution of the present disclosure provides a forming method of a semiconductor structure where the contact holes of the gate and the source-drain doping layers can be formed by conducting a one-time patterning process on the dielectric layer, and the integration degree of the semiconductor structure can be increased.

FIG. 1 to FIG. 19 are structural schematic diagrams corresponding to each step in one form of a forming method of the semiconductor structure of the present disclosure.

Figure 1:
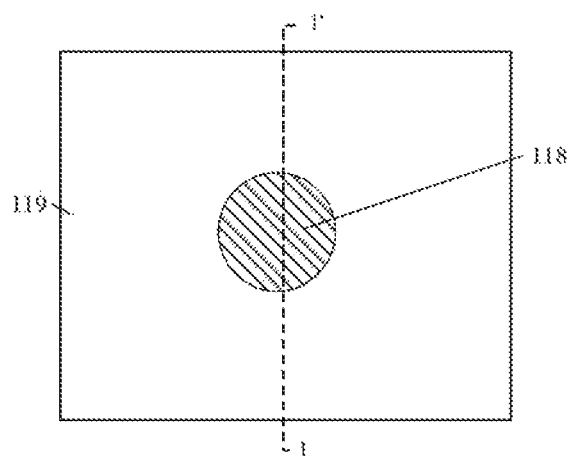
FIG. 1 to FIG. 19 are structural schematic diagrams corresponding to each step in one form of a forming method of a semiconductor structure of the present disclosure.
Figure 2:
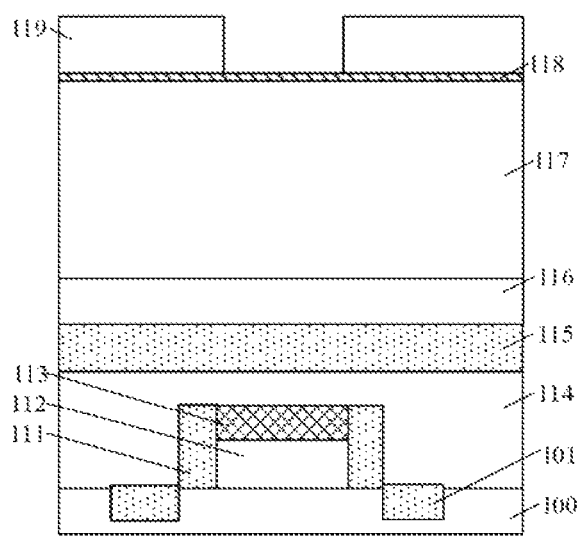

Referring to FIG. 1 and FIG. 2, FIG. 2 is a section view of FIG. 1 along a cutting line 1-1' A substrate 100 is provided with a gate 112, where source-drain doping layers 101 are located in positions, on the two sides of the gate 112, in the substrate 100, and the gate 112 and the source-drain doping layers 101 are provided with a dielectric layer 114.

In some implementations the substrate 100 comprises a base, and a fin located on the base. In other implementations, the substrate can exclude the fin, and the substrate is a silicon substrate, a germanium substrate, silicon on insulator or other semiconductor substrates.

The material of the base is silicon, germanium or silicon germanium.

In some implementations, the substrate 100 also includes an isolation structure located on the base, and the isolation structure exposes the top and the surface of part of a side wall of the fin.

In some implementations, the gate 112 stretches across the fin and covers part of the top and the surface of the side wall of the fin.

In some implementations, the gate 112 is a metal gate 112 or a polysilicon gate 112.

A side wall of the gate 112 is provided with first protective layers 111; and the top of the gate 112 is provided with a second protective layer 113. The material of the first protective layers 111 is silicon nitride; and the material of the second protective layer 113 is silicon nitride.

The material of the source-drain doping layers 101 is silicon, silicon germanium or silicon carbide. Doped ions exist in the source-drain doping layers 101, and are boron ions or phosphorus ions.

Subsequently, a patterning layer is formed on the dielectric layer 114, and the steps of forming the patterning layer include: forming sacrificial layers and spacer on the dielectric layer 114, wherein the sacrificial layers and the spacer cover the dielectric layer 114 at the top of the gate 112 and expose the dielectric layer 114 on at least part of the source-drain doping layers 101 the sacrificial layers include the first sacrificial layer located on the dielectric layer 114 at the top of the gate 112, and side walls of the first sacrificial layer are provided with the spacer; and after the sacrificial layers and the spacer is formed, removing the first sacrificial layer.

In some implementations, the steps of forming the patterning layer also include: before the sacrificial layers and the spacer is formed on the dielectric layer 114, forming an initial patterning layer on the dielectric layer 114; and after the first sacrificial layer is removed, etching the initial patterning layer with the remaining sacrificial layer and the spacer as a mask to form the patterning layer. In other implementations, the initial patterning layer may not be formed, and the remaining sacrificial layer after the first sacrificial layer is removed and the spacer is taken as the mask.

Specifically, in one form, the steps of forming the patterning layer are shown in FIG. 1 to FIG. 16.

Please continue to refer to FIG. 1 and FIG. 2, the initial patterning layer 115 is formed on the dielectric layer 114.

In some implementations, the material of the initial patterning layer 115 is different from the material of the dielectric layer 114.

The material of the initial patterning layer 115 is titanium nitride or silicon nitride. Specifically, in some implementations, the material of the initial patterning layer 115 is titanium nitride.

The thickness of the initial patterning layer 115 is 10-50 nm.

A process for forming the initial patterning layer 115 includes a chemical vapor deposition process or an atomic layer deposition process.

Subsequently, the sacrificial layers and the spacer is formed on the dielectric layer 114, the sacrificial layers expose the dielectric layer 114 on at least part of the source-drain doping layers 101, the sacrificial layers include the first sacrificial layer, the first sacrificial layer covers the dielectric layer 114 on at least part of the gate 112, and the side walls of the first sacrificial layer 121 are provided with the spacer.

In some implementations, the first sacrificial layer 121 covers the dielectric layer 114 at the top of part of the gate 112; and the sacrificial layers also include the second sacrificial layer 126, and the second sacrificial layer 126 covers the dielectric layer 114 at the top of the gate 112 exposed by the first sacrificial layer 121. In other implementations, the first sacrificial layer completely covers the dielectric layer at the top of the gate, and the sacrificial layers can exclude the second sacrificial layer.

In some implementations, the steps of forming the sacrificial layers and the spacer 120 are shown in FIG. 1 to FIG. 13.

Subsequently, the first sacrificial layer 121 is formed on the dielectric layer 114, and the first sacrificial layer 121 covers the dielectric layer 114 on part of the gate 112. Specifically, the steps of forming the first sacrificial layer 121 are shown in FIG. 1 to FIG. 4.

Continuing to refer to FIG. 1 and FIG. 2, a first initial sacrificial layer 116 is formed on the dielectric layer 114.

In some implementations, the material of the first initial sacrificial layer 116 is not the same as the material of the initial patterning layer 115.

The material of the first initial sacrificial layer 116 is amorphous silicon, amorphous germanium or amorphous carbon. Specifically, in some implementations, the material of the first initial sacrificial layer 116 is amorphous silicon.

A process for forming the first initial sacrificial layer 116 includes a chemical vapor deposition process or an atomic layer deposition process.

The thickness of the first initial sacrificial layer 116 is 20-50 nm.

Continuing to refer to FIG. 1 and FIG. 2, a first mask layer is formed on the first initial sacrificial layer 116, and the first mask layer exposes the dielectric layer 114 on at least part of the gate 112.

The steps of forming the first mask layer include: forming a first initial mask layer on the first initial sacrificial layer 116; and conducting first graphics on the first initial mask layer, and exposing the first initial sacrificial layer 116 on part of the gate 112 to form the first mask layer.

The steps of forming the first initial mask layer include: forming a first flat layer 117 on the first initial sacrificial layer 116; forming a first anti-reflective layer 118 on the first flat layer 117; and forming a first initial photoresist layer on the first anti-reflective layer 118.

The first flat layer 117 is configured to provide a flat bottom surface for the first mask layer and the first anti-reflective layer. The first anti-reflective layer 118 is configured to reduce reflection of light by a pattern below the first initial photoresist layer.

The material of the first flat layer 117 is silicon oxide or an organic material. A process for forming the first flat layer 117 includes a spin coating process.

The material of the first anti-reflective layer 118 is an organic anti-reflective material or an inorganic anti-reflective layer material, such as silicon.

A process for forming the first initial photoresist layer includes a spin coating process.

The steps of conducting first graphics on the initial mask layer include: forming the first initial photoresist layer on the first anti-reflective layer 118; photoetching the first initial photoresist layer, and exposing the first anti-reflective layer 118 on part of the gate 112 to form a first photoresist layer 119; and etching the first anti-reflective layer 118 and the first flat layer 117 with the first photoresist layer 119 as a mask, and exposing the first initial sacrificial layer 116 on part of the gate 112.

Figure 3:
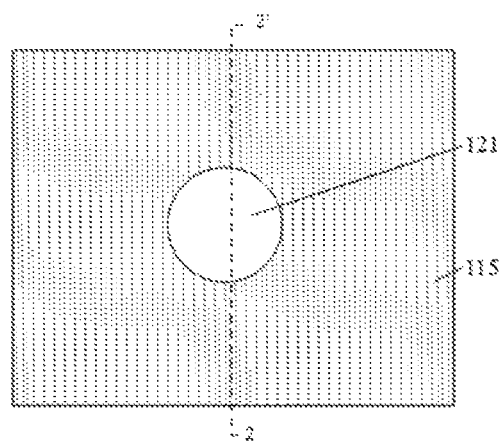
Figure 4:
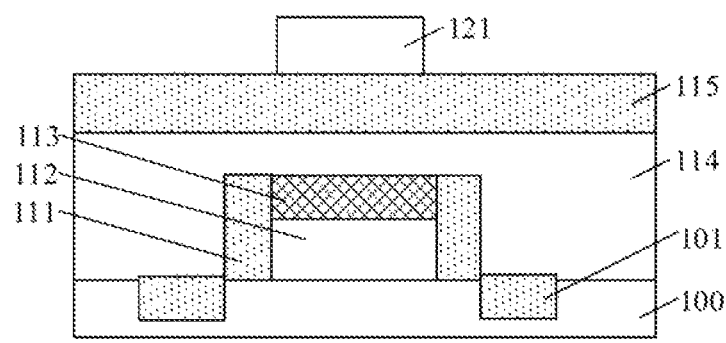

Referring to FIG. 3 and FIG. 4, FIG. 4 is a section view of FIG. 3 along a cutting line 2-2', the first initial sacrificial layer 116 is subjected to ion implantation with the first mask layer as a mask to form the first sacrificial layer 121; and after ion implantation, the first initial sacrificial layer 116 (as shown in FIG. 2) is removed.

The ion implantation is configured to increase the etching selection ratio of the first sacrificial layer 121 to the first initial sacrificial layer 116, thus the first initial sacrificial layer 116 is advantageously removed, and the first sacrificial layer 121 is retained.

Implanted ions of the ion implantation are boron ions or phosphorus ions.

After the ion implantation, the removal of the first mask layer is also included. A process for removing the first mask layer includes: a dry etching process, a wet etching process or an ashing process.

A process for removing the first initial sacrificial layer 116 includes: dry etching or wet etching. Specifically, in some implementations, the process for removing the first initial sacrificial layer 116 is wet etching.

An etching agent of wet etching for removing the first initial sacrificial layer 116 includes: ammonium hydroxide or tetramethylammonium hydroxide.

Figure 5:
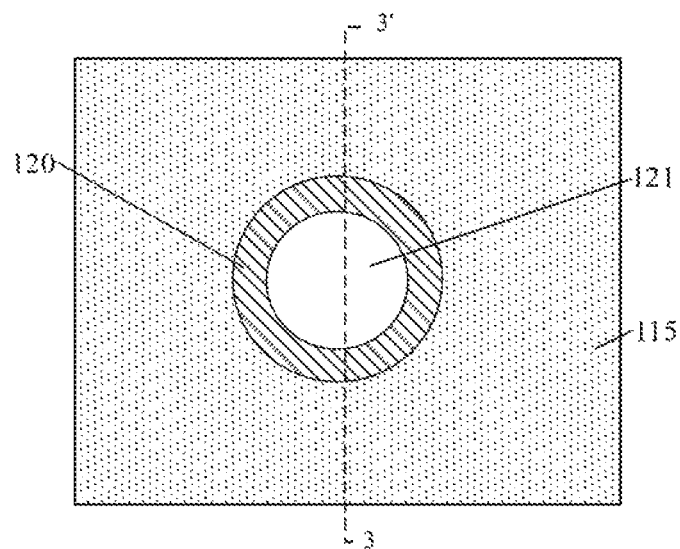
Figure 6:
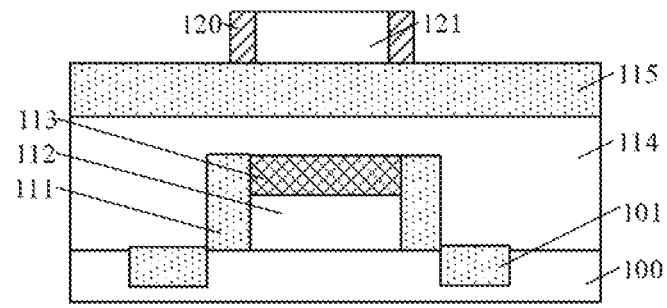

Referring to FIG. 5 and FIG. 6, FIG. 6 is a section view of FIG. 5 along a cutting line 3-3', and the spacer 120 are formed on the side walls of the first sacrificial layer 121.

The spacer 120 are configured to isolate a groove, for exposing the source-drain doping layers 101, in the first sacrificial layer 121 from a second opening of the gate 112.

The steps of forming the spacer 120 include: forming initial spacer on surfaces of the top and the side walls of the first sacrificial layer 121, and on the dielectric layer 114 exposed by the first sacrificial layer 121; and recessing the initial spacer, and removing the initial spacer at the top of the first sacrificial layer 121 and on the dielectric layer 114 exposed by the first sacrificial layer 121 to form the spacer 120.

If the spacer 120 is too thin, increasing of the integration degree of the semiconductor structure is not facilitated; and if the spacer is too thick, the process difficulty is prone to being increased. In some implementations, the thickness of the spacer 120 is 5-20 nm.

The material of the spacer 120 is different from the material of the first sacrificial layer 121.

The material of the spacer 120 is silicon nitride, titanium nitride or titanium oxide. Specifically, the material of the spacer 120 is silicon nitride.

A process for recessing the initial spacer includes anisotropic dry etching.

After the spacer 120 is subsequently formed, the second sacrificial layer is formed on the dielectric layer 114, and the second sacrificial layer covers the gate 112 exposed by the first sacrificial layer 121, and exposes the dielectric layer 114 at the tops of at least part of the source-drain doping layers 101.

The steps of forming the second sacrificial layer 126 are shown in FIG. 7 to FIG. 12.

Figure 7:
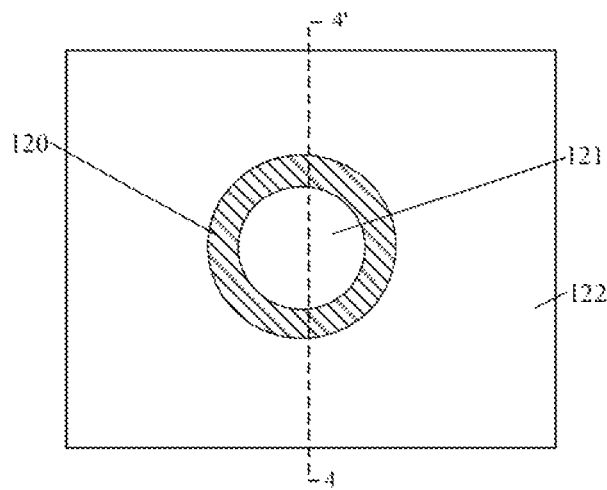
Figure 8:
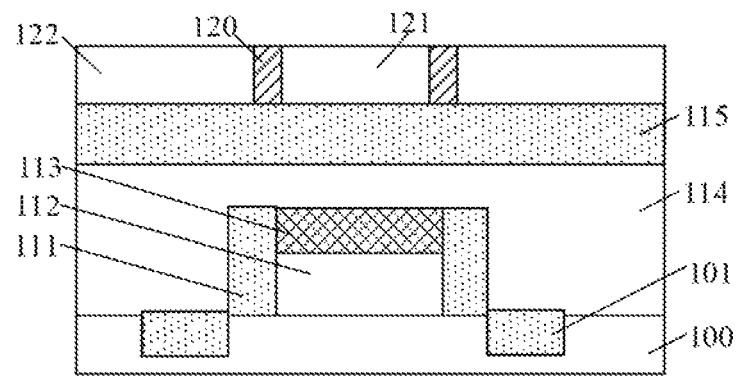

Referring to FIG. 7 and FIG. 8, FIG. 8 is a section view of FIG. 7 along a cutting line 4-4', a second intermediate sacrificial layer 122 is formed on the dielectric layer 114, and the second intermediate sacrificial layer 122 exposes the spacer 120 and the first sacrificial layer 121.

The steps of forming the second intermediate sacrificial layer 122 include: forming second initial sacrificial layers on the dielectric layer 114, the first sacrificial layer 121 and the spacer 120; and removing the second initial sacrificial layer at the top of the first sacrificial layer 121 to form the second sacrificial layer 126.

The material of the second initial sacrificial layers is different from the material of the first sacrificial layer 121; and the material of the second initial sacrificial layers is different from the material of the initial patterning layer 115.

The material of the second initial sacrificial layers is silicon oxide or silicon nitride.

In some implementations, the second initial sacrificial layers are not the same as the spacer 120 in material, and in other implementations, the material of the second initial sacrificial layers is the same as the material of the spacer 120.

The second initial sacrificial layers are not the same as the spacer 120 in material, and the loss of the spacer 120 can be reduced in the process of removing the second initial sacrificial layer at the top of the first sacrificial layer.

A process for forming the second initial sacrificial layers includes a chemical vapor deposition process or an atomic layer deposition process.

A process for removing the second initial sacrificial layer at the top of the first sacrificial layer 121 includes an etching process or a chemical mechanical polishing process.

Subsequently, the second intermediate sacrificial layer 122 is etched, and the second intermediate sacrificial layer 122 on at least part of the source-drain doping layers 101 is removed to form the second sacrificial layer.

The steps of etching the second intermediate sacrificial layer 122 to remove the second intermediate sacrificial layer 122 on at least part of the source-drain doping layers 101 are shown in FIG. 9 to FIG. 12.

Figure 9:
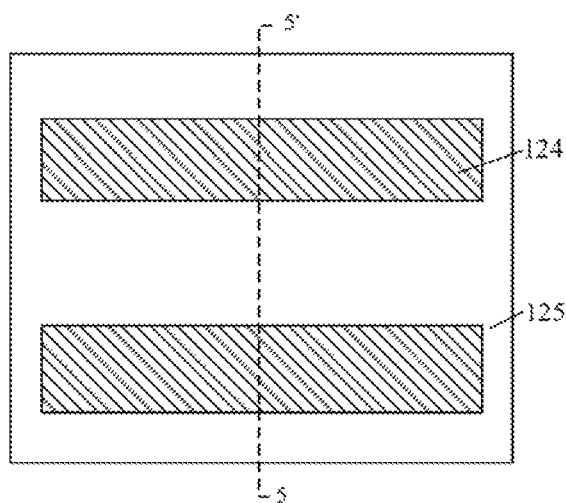
Figure 10:
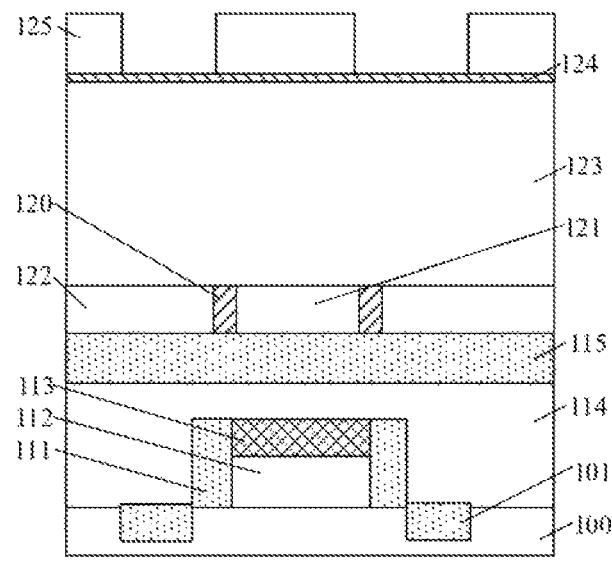

Referring to FIG. 9 and FIG. 10, FIG. 10 is a section view of FIG. 9 along a cutting line 5-5', a second mask layer is formed on the second intermediate sacrificial layer 122, and the second mask layer exposes the dielectric layer 114 on at least part of the source-drain doping layers 101.

The steps of forming the second mask layer include: forming a second initial mask layer on the second intermediate sacrificial layer 122; and conducting second patterning on the second initial mask layer, and exposing the second intermediate sacrificial layer 122 on part of the source-drain doping layers 101 to form the second mask layer.

The steps of forming the second initial mask layer include: forming a second flat layer 123 on the second intermediate sacrificial layer 122; forming a second anti-reflective layer 124 on the second flat layer 123; and forming a second initial photoresist layer on the second anti-reflective layer 124.

The second flat layer 123 is configured to provide a flat bottom surface for the second initial photoresist layer and the second anti-reflective layer 124. The second anti-reflective layer 124 is configured to reduce reflection of light by a pattern below the second initial photoresist layer.

The material of the second flat layer 123 is silicon oxide or an organic material. A process for forming the second flat layer 123 includes a spin coating process.

The material of the second anti-reflective layer 124 is an organic anti-reflective material or an inorganic anti-reflective material, such as silicon.

A process for forming the second initial photoresist layer includes a spin coating process.

The steps of second patterning include: photoetching the second initial photoresist layer, and exposing the second anti-reflective layer 124 on part of the source-drain doping layers 101 to form a second photoresist layer 125; and etching the second anti-reflective layer 124 and the second flat layer 123 with the second photoresist layer 125 as a mask, and exposing the second intermediate sacrificial layer 122 on part of the source-drain doping layers 101.

Figure 11:
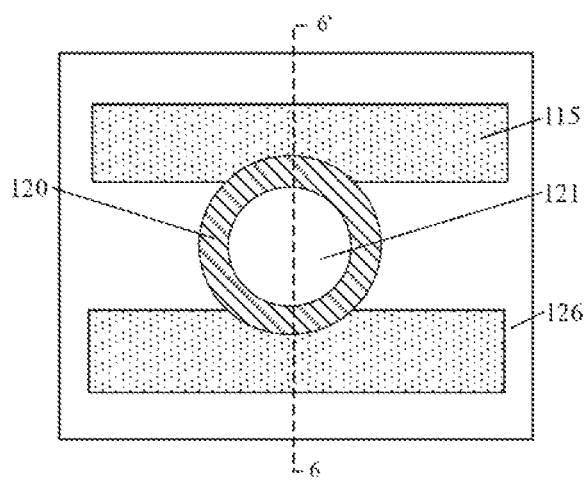
Figure 12:
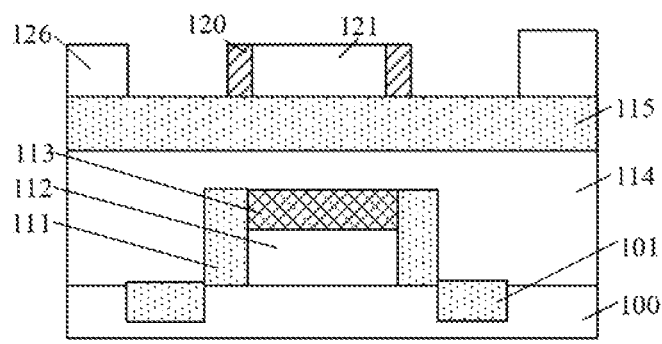

Referring to FIG. 11 and FIG. 12, FIG. 12 is a section view of FIG. 11 along a cutting line 4-4', a second intermediate layer is etched with the second mask layer as a mask, and the second intermediate sacrificial layer 122 on at least part of the source-drain doping layers 101 is removed to form the second sacrificial layer 126.

In some implementations, etching gas for etching the second intermediate sacrificial layer 122 includes $C_4F_6$ or $C_4F_8$.

The second intermediate layer is etched with the second mask layer as the mask, the second intermediate sacrificial layer 122 on at least part of the source-drain doping layers 101 is removed, and a groove is formed in the second intermediate sacrificial layer 122.

In some implementations, the bottom of the groove exposes the entire initial patterning layer 115 at the tops of the source-drain doping layers 101. In other implementations, the bottom of the groove exposes part of the initial patterning layer at the tops of the source-drain doping layers.

In some implementations, the bottom of the groove exposes part of the initial patterning layer 115 at the tops of the first protective layers 111 on the side wall of the gate 112. In other implementations, the bottom of the groove does not expose the initial patterning layer at the tops of the first protective layers on the side wall of the gate.

Figure 13:
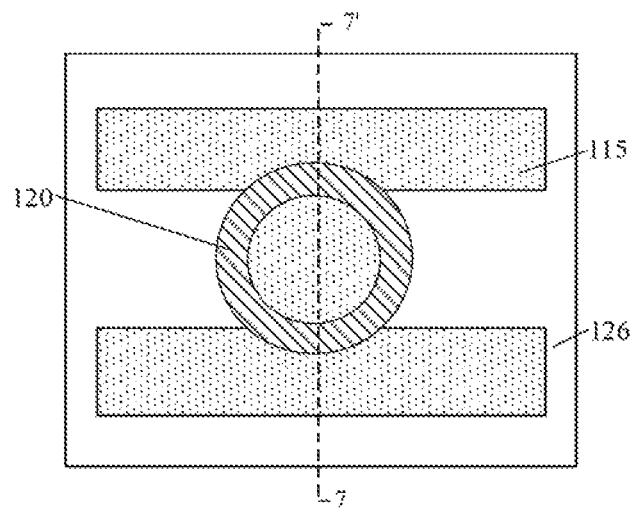
Figure 14:
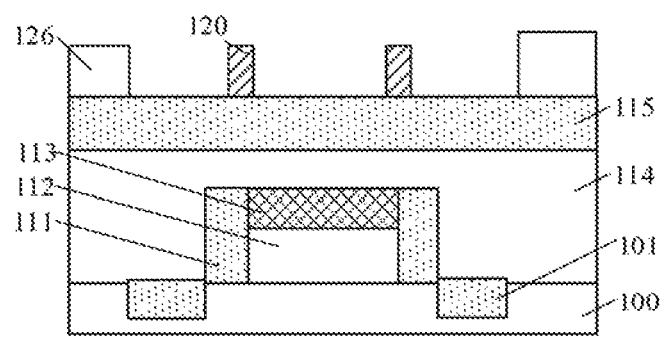

Please refer to FIG. 13 and FIG. 14, FIG. 14 is a section view of FIG. 13 along a cutting line 7-7', and after the sacrificial layers are formed, the first sacrificial layer 121 (as shown in FIG. 12) is removed.

A method of removing the first initial sacrificial layer 116 includes wet etching or dry etching.

Etching gas for removing the first initial sacrificial layer 116 includes chlorine gas or hydrogen bromide.

In some implementations, after the first sacrificial layer is removed, second openings are formed in the spacer.

The cross section of the second openings is a circle, a rectangle or a hexagon.

The patterning layer 127 is formed through the method of removing the first sacrificial layer after the spacer 120 are formed on the side walls of the first sacrificial layer 121, the spacer 120 can be formed between grooves for exposing the dielectric layer 114 at the tops of the source-drain doping layers 101 and second openings for exposing the dielectric layer 114 at the top of the gate 112 of the sacrificial layers, the thickness of the spacer 120 is small, and thus the integration degree of the semiconductor structure can be increased. Meanwhile, through the method of forming the spacer 120, the contact holes of the gate 112 and the source-drain doping layers 101 can be formed only by conducting the one-time patterning process on the dielectric layer 114, the problem of graphic alignment in the double patterning process can be avoided, then the process can be simplified, and the accuracy of the formed semiconductor structure can be improved.

Figure 15:
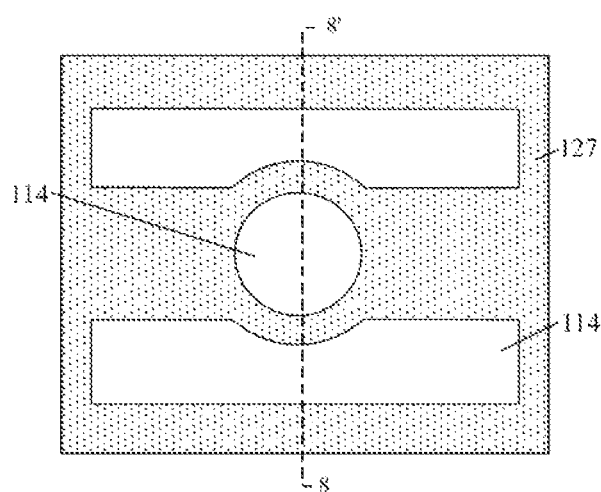
Figure 16:
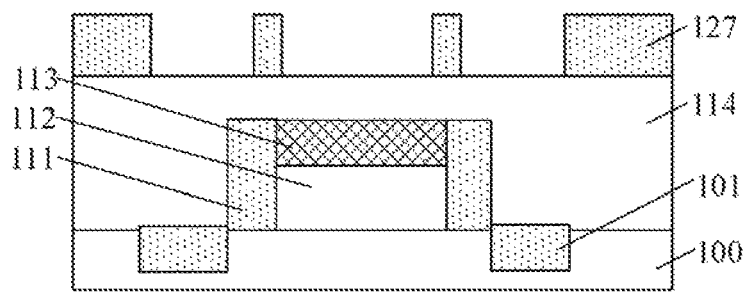

Referring to FIG. 15 and FIG. 16, FIG. 16 is a section view of FIG. 15 along a cutting line 8-8', after the first sacrificial layer 121 (shown in FIG. 12) is removed, the initial patterning layer 115 is etched with the remaining sacrificial layer and the spacer 120 as the mask to form the patterning layer 127.

It needs to be noted that in some implementations, the sacrificial layers include the second sacrificial layer 126, and the steps of etching the initial patterning layer 115 with the remaining sacrificial layer and the spacer 120 as the mask after the first sacrificial layer 121 is removed include: etching the initial patterning layer with the second sacrificial layer 126 and the spacer 120 as the mask. In other implementations, the sacrificial layers do not include the second sacrificial layer, and the step for etching the initial patterning layer includes: etching the initial patterning layer with the spacer as the mask.

The material of the patterning layer 127 is different from the material of the first protective layers 111, and the material of the second protective layer 113 is different from the material of the patterning layer 127. The material of the patterning layer 127 is titanium nitride or silicon nitride.

A process for etching the initial patterning layer 115 includes dry etching or wet etching. Specifically, the process for etching the initial patterning layer includes anisotropic dry etching.

Figure 17:
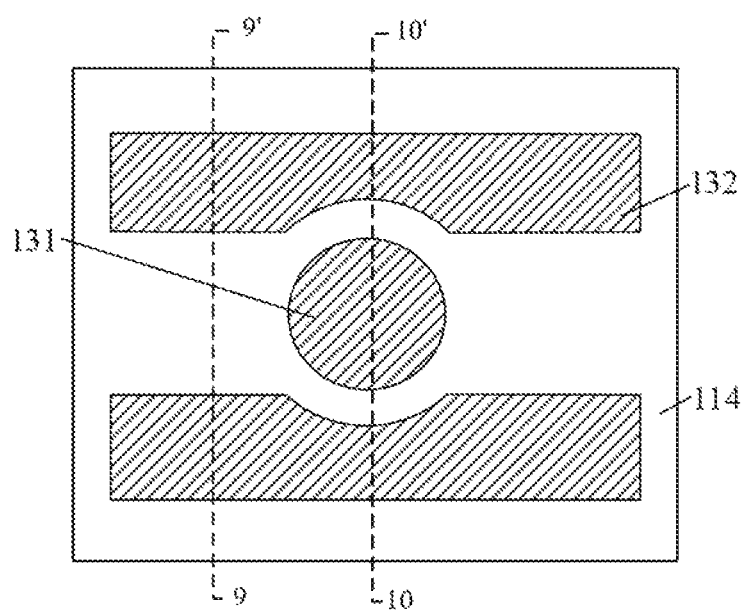
Figure 18:
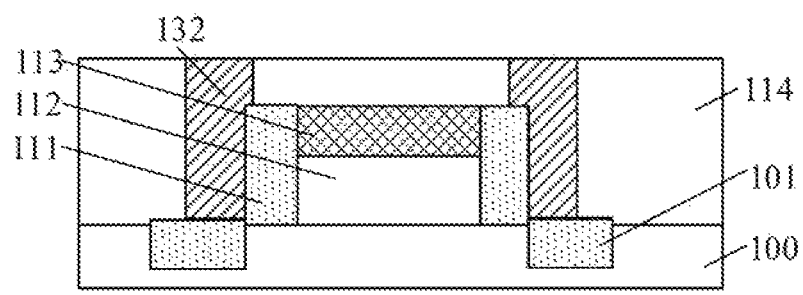
Figure 19:
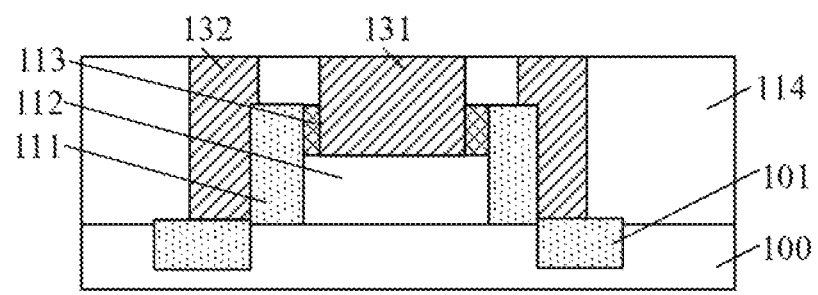

Referring to FIG. 17 to FIG. 19, FIG. 18 is a section view of FIG. 17 along a cutting line 9-9', FIG. 19 is a section view of FIG. 17 along a cutting line 10-10', the dielectric layer 114 is etched with the patterning layer 127 as a mask, the first contact hole and the second contact holes are formed in the dielectric layer 114, the bottom of the first contact hole exposes the gate 112, and the bottoms of the second contact holes expose the source-drain doping layers 101.

In some implementations, a top surface of the gate 112 is provided with the second protective layer 113, and etching treatment also includes etching the second protective layer 113 till the gate 112 is exposed.

The cross section of the first contact hole is a circle, a rectangle or a hexagon. The cross section of the second contact holes is in a long strip shape.

Before the sacrificial layers and the spacer is formed, the initial patterning layer 115 is formed on the dielectric layer 114, and the patterning layer 127 can be subsequently formed through the initial patterning layer 115. Through transmission of the initial patterning layer 115, the material of the patterning layer can be consistent, thus the dielectric layer 114 can be etched by selecting gas with the high etching selection ratio in the process of etching the dielectric layer 114, the accuracy of the sizes of the first contact hole and the second contact holes can be guaranteed, and penetrating of the first contact hole and the second contact holes is avoided.

Continuing to refer to FIG. 17 to FIG. 19, a first plug 131 is formed in the first contact hole, and second plugs 132 are formed in the second contact holes.

The material of the first plug 131 is metal, such as tungsten, and the material of the second plugs 132 is metal, such as tungsten.

The semiconductor structure of the present disclosure also provides another embodiment, and the differences between this embodiment and the embodiments shown in FIG. 1 to FIG. 19 include:

The steps of forming sacrificial layers and spacer include: forming an initial layer on a dielectric layer; patterning the initial layer, and forming a first opening in the initial layer, wherein the first opening exposes the dielectric layer on at least part of a gate layer; forming the spacer on a side wall of the first opening; forming the first sacrificial layer in the first opening after the spacer is formed; and after the first sacrificial layer is formed, removing the initial layer on at least part of source-drain doping layers to form the second sacrificial layer.

The semiconductor structure of the present disclosure also provides another implementation, which differs from the previous two implementations in that the step of etching a dielectric layer with a patterning layer as a mask includes: after a first sacrificial layer is removed, etching the dielectric layer with the remaining sacrificial layer and spacer as a mask.

That is, in some implementations, the patterning layer includes: the first sacrificial layer and the remaining sacrificial layer after the first sacrificial layer is removed.

When the sacrificial layers include the second sacrificial layer, the patterning layer includes the second sacrificial layer and a mask layer, and etching the dielectric layer with the remaining sacrificial layer and the spacer as the mask includes: etching the dielectric layer with the second sacrificial layer and the spacer as the mask.

When the sacrificial layers only include the first sacrificial layer, the first sacrificial layer completely covers the media layer at the top of a gate, and the patterning layer only includes the mask layer; and etching the dielectric layer with the remaining sacrificial layer and the spacer as the mask includes: etching the dielectric layer with the spacer as the mask.

In some implementations, the second sacrificial layer is the same as the spacer in material. The second sacrificial layer is the same as the spacer in material, the material of the patterning layer can be the same, thus when the dielectric layer is etched, the etching selection ratio is advantageously increased, and penetrating of the first contact hole and the second contact holes is prevented.

The technical solution of the present disclosure also provides a semiconductor structure, which is formed by the forming method shown in FIG. 1 to FIG. 9.

Although the present disclosure is disclosed as above, the present disclosure is not limited thereto. A person skilled in the art may make variations and modifications without departing from the spirit and scope of the present disclosure. Therefore, the protection scope of the present disclosure should be subject to the claims.

What is claimed is:

1. A forming method of a semiconductor structure, comprising:
   providing a substrate, wherein a gate is located on the substrate, source-drain doping layers are located in positions, on two sides of the gate, in the substrate, and a dielectric layer is located on the gate and the source-drain doping layers;
   forming a patterning layer on the dielectric layer, wherein the step of forming the patterning layer comprises:
   forming sacrificial layers and spacer on the dielectric layer, wherein the sacrificial layers and the spacer cover the dielectric layer at a top of the gate, and expose the dielectric layer on at least part of the source-drain doping layers, the sacrificial layers comprise a first sacrificial layer located on the dielectric layer at the top of the gate, and side walls of the first sacrificial layer are provided with the spacer;
   after the sacrificial layers and the spacer is formed, removing the first sacrificial layer; and
   etching the dielectric layer with the patterning layer as a mask, and forming a first contact hole and second contact holes in the dielectric layer, wherein a bottom of the first contact hole exposes the gate, and bottoms of the second contact holes expose the source-drain doping layers.

2. The forming method of the semiconductor structure according to claim 1, wherein the steps of forming the patterning layer further comprise:
   before the sacrificial layers and the spacer is formed on the dielectric layer, forming an initial patterning layer on the dielectric layer; and
   after the first sacrificial layer is removed, etching the initial patterning layer with the remaining sacrificial layer and the spacer as a mask to form the patterning layer.

3. The forming method of the semiconductor structure according to claim 2, wherein the material of the patterning layer is titanium nitride or silicon nitride.

4. The forming method of the semiconductor structure according to claim 1, wherein:
   the first sacrificial layer covers the dielectric layer at the top part of the gate; and
   the sacrificial layers further comprise the second sacrificial layer, and the second sacrificial layer covers the dielectric layer at the top of the gate exposed by the first sacrificial layer.

5. The forming method of the semiconductor structure according to claim 4, wherein the steps of forming the sacrificial layers and the spacer on the dielectric layer comprise:
forming the first sacrificial layer on the dielectric layer, wherein the first sacrificial layer only covers the dielectric layer on part of the gate;
forming the spacer on side walls of the first sacrificial layer; and
after the spacer is formed, forming the second sacrificial layer on the dielectric layer, wherein the second sacrificial layer covers the gate exposed by the first sacrificial layer, and exposes the dielectric layer at the tops of at least part of the source-drain doping layers.

6. The forming method of the semiconductor structure according to claim 5, wherein the steps of forming the first sacrificial layer on the dielectric layer comprise:
forming a first initial sacrificial layer on the dielectric layer;
forming a first mask layer on the first initial sacrificial layer, wherein the first mask layer exposes the first initial sacrificial layer on at least part of the gate;
conducting ion implantation on the first initial sacrificial layer with the first mask layer as a mask to form the first sacrificial layer; and
after ion implantation, removing the first initial sacrificial layer.

7. The forming method of the semiconductor structure according to claim 6, wherein implanted ions for ion implantation of the first initial sacrificial layer are boron ions.

8. The forming method of the semiconductor structure according to claim 5, wherein after the spacer is formed, the steps of forming the second sacrificial layer on the dielectric layer comprise:
forming a second intermediate sacrificial layer on the dielectric layer, wherein the second intermediate sacrificial layer exposes the spacer and the first sacrificial layer; and
etching the second intermediate sacrificial layer and removing the second intermediate sacrificial layer on at least part of the source-drain doping layers to form the second sacrificial layer.

9. The forming method of the semiconductor structure according to claim 8, wherein the steps of forming a second intermediate sacrificial layer comprise:
forming second initial sacrificial layers on the dielectric layer, the first sacrificial layer and the spacer; and
removing the second initial sacrificial layer at the top of the first sacrificial layer to form the second sacrificial layer.

10. The forming method of the semiconductor structure according to claim 8, wherein etching gas for etching the second intermediate sacrificial layer comprises $C_4F_6$ or $C_4F_8$.

11. The forming method of the semiconductor structure according to claim 5, wherein the steps of forming the spacer on the side walls of the first sacrificial layer comprise:
forming initial spacer on the top and the side wall of the first sacrificial layer, and on the dielectric layer exposed by the first sacrificial layer; and
recessing the initial spacer, and removing the initial spacer at the top of the first sacrificial layer and on the dielectric layer exposed by the first sacrificial layer to form the spacer.

12. The forming method of the semiconductor structure according to claim 4, wherein the material of the second sacrificial layer is different from the material of the first sacrificial layer, and the material of the spacer is different from the material of the first sacrificial layer.

13. The forming method of the semiconductor structure according to claim 4, wherein the material of the second sacrificial layer is different from the material of the spacer.

14. The forming method of the semiconductor structure according to claim 13, wherein the material of the first sacrificial layer is amorphous silicon; the material of the spacer is silicon nitride, titanium nitride or titanium oxide; and the material of the second sacrificial layer is silicon oxide.

15. The forming method of the semiconductor structure according to claim 1, wherein the step of etching the dielectric layer with the patterning layer as the mask comprises:
after the first sacrificial layer is removed, etching the dielectric layer with the remaining sacrificial layer and the spacer as a mask.

16. The forming method of the semiconductor structure according to claim 1, wherein the thickness of the spacer is 5-20 nm.

17. The forming method of the semiconductor structure according to claim 1, wherein:
a side wall of the gate is provided with first protective layers;
the top of the gate is provided with a second protective layer; and
the material of the patterning layer is different from the material of the first protective layers, and the material of the second protective layer is different from the material of the patterning layer.

18. The forming method of the semiconductor structure according to claim 1, wherein a process for removing the first sacrificial layer comprises dry etching or wet etching.

19. The forming method of the semiconductor structure according to claim 1, wherein the steps of forming the sacrificial layers and the spacer comprise:
forming an initial layer on the dielectric layer;
conducting graphics on the initial layer, and forming a first opening in the initial layer, wherein the first opening exposes the dielectric layer on at least part of a gate layer;
forming the spacer on a side wall of the first opening;
forming the first sacrificial layer in the first opening after the spacer is formed; and
after the first sacrificial layer is formed, removing the initial layer on at least part of the source-drain doping layers to form the second sacrificial layer.

* * * * *